(12) United States Patent
Parthasarathy et al.

(10) Patent No.: US 8,395,207 B2
(45) Date of Patent: *Mar. 12, 2013

(54) HIGH-VOLTAGE VERTICAL TRANSISTOR WITH A VARIED WIDTH SILICON PILLAR

(75) Inventors: Vijay Parthasarathy, Mountain View, CA (US); Sujit Banerjee, San Jose, CA (US); Lin Zhu, San Jose, CA (US)

(73) Assignee: Power Integrations, Inc., San Jose, CA (US)

( * ) Notice: Subject to any disclaimer, the term of this patent is extended or adjusted under 35 U.S.C. 154(b) by 6 days.

This patent is subject to a terminal disclaimer.

(21) Appl. No.: 13/134,504

(22) Filed: Jun. 8, 2011

(65) Prior Publication Data

US 2011/0233657 A1 Sep. 29, 2011

Related U.S. Application Data

(63) Continuation of application No. 12/284,086, filed on Sep. 18, 2008, now Pat. No. 7,964,912.

(51) Int. Cl.
*H01L 29/772* (2006.01)

(52) U.S. Cl. ........ 257/328; 257/330; 257/401; 257/409; 257/E29.262

(58) Field of Classification Search .................. 257/488
See application file for complete search history.

(56) References Cited

U.S. PATENT DOCUMENTS 7,964,912 B2 * 6/2011 Parthasarathy et al. ....... 257/328

* cited by examiner

*Primary Examiner* — Stephen W Smoot
(74) *Attorney, Agent, or Firm* — The Law Offices of Bradley J. Bereznak

(57) ABSTRACT

In one embodiment, a vertical HVFET includes a pillar of semiconductor material a pillar of semiconductor material arranged in a loop layout having at least two substantially parallel and substantially linear fillet sections each having a first width, and at least two rounded sections, the rounded sections having a second width narrower than the first width, a source region of a first conductivity type being disposed at or near a top surface of the pillar, and a body region of a second conductivity type being disposed in the pillar beneath the source region. First and second dielectric regions are respectively disposed on opposite sides of the pillar, the first dielectric region being laterally surrounded by the pillar, and the second dielectric region laterally surrounding the pillar. First and second field plates are respectively disposed in the first and second dielectric regions.

18 Claims, 7 Drawing Sheets

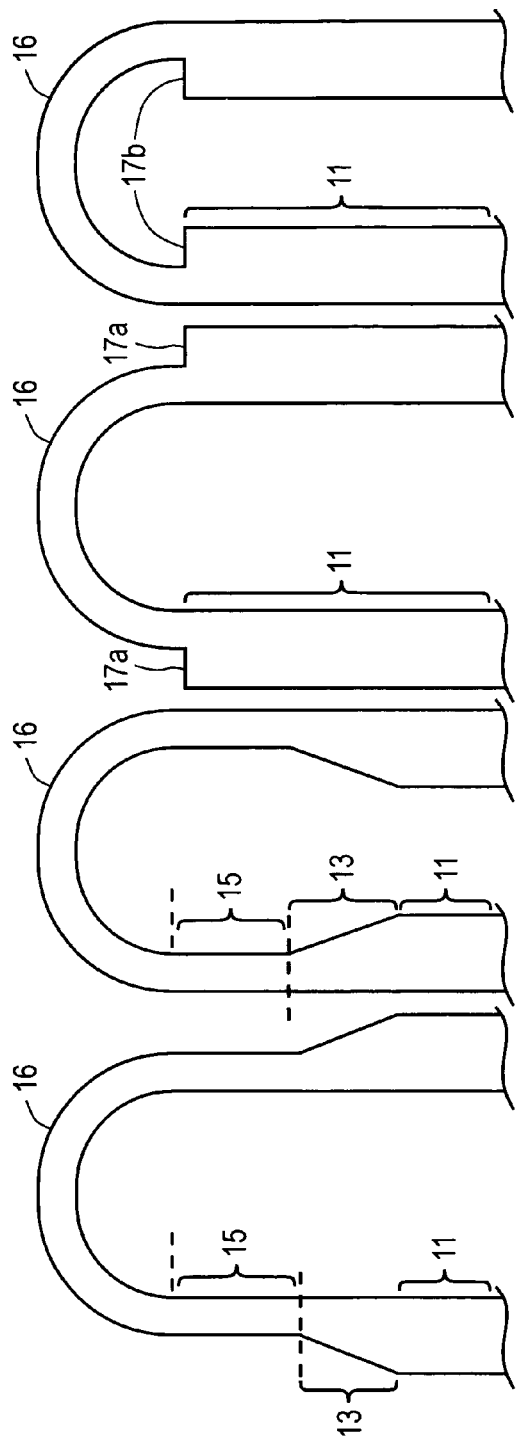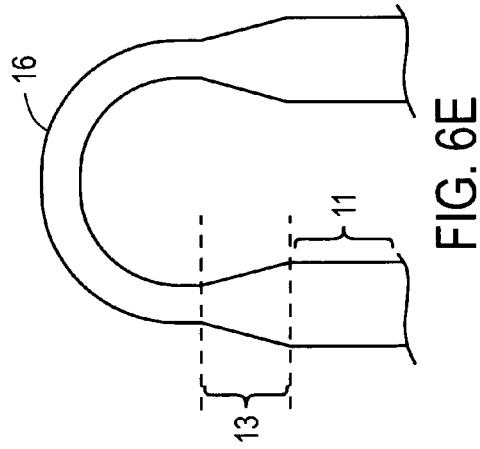

HIGH-VOLTAGE VERTICAL TRANSISTOR WITH A VARIED WIDTH SILICON PILLAR

This application is a continuation of application Ser. No. 12/284,086, filed Sep. 18, 2008, now U.S. Pat. No. 7,964,912, entitled, "HIGH-VOLTAGE VERTICAL TRANSISTOR WITH A VARIED WIDTH SILICON PILLAR", which is assigned to the assignee of the present application.

TECHNICAL FIELD

The present disclosure relates to field-effect semiconductor transistor structures capable of withstanding high voltages.

BACKGROUND

High-voltage, field-effect transistors (HVFETs) are well known in the semiconductor arts. Many HVFETs employ a device structure that includes an extended drain region that supports or blocks the applied high-voltage (e.g., several hundred volts) when the device is in the "off" state. HVFETs of this type are commonly used in power conversion applications such as AC/DC converters for offline power supplies, motor controls, and so on. These devices can be switched at high voltages and achieve a high blocking voltage in the off state while minimizing the resistance to current flow in the "on" state. The blocking or breakdown voltage is generally denoted as Vbd or BV for short. The acronym Rds refers to the product of the resistance and surface area in the extended drain region, and is generally used to describe the on-state performance of the device.

In prior art vertical HVFET structures, a mesa or pillar of semiconductor material forms the extended drain or drift region for current flow in the on-state. The silicon pillar structure is typically formed in the shape of a racetrack, with the pillar structure being repeated in a direction perpendicular to the pillar length. FIG. 1 shows one end of a silicon pillar layout for a conventional high-voltage vertical transistor. This structure is characterized by a pair of long, straight fillet regions connected by a half-circular (i.e., radial) tip region. The pillar width (PW) in the tip and fillet regions is constant throughout. The vertical device structure is characterized by a trench gate formed near the top of the substrate, adjacent the sidewall regions of the pillar where a body region is disposed above the extended drain region. Application of an appropriate voltage potential to the gate causes a conductive channel to be formed along the vertical sidewall portion of the body region such that current may flow vertically through the semiconductor material, i.e., from a top surface of the substrate where the source region is disposed, through the drift region down to the bottom of the substrate where the drain region is located. The drift region is usually lightly doped to support high voltages applied to the drain when the device is off. The decrease in doping and increase in length of the extended drain region therefore has a deleterious effect on the on-state performance of the device, as both cause an increase in on-state resistance. In other words, conventional high-voltage FET designs are characterized by a trade-off between BV and Rds.

BRIEF DESCRIPTION OF THE DRAWINGS

The present disclosure will be understood more fully from the detailed description that follows and from the accompanying drawings, which however, should not be taken to limit the invention to the specific embodiments shown, but are for explanation and understanding only.

FIGS. 6A-6E illustrates various example layouts of one end of a racetrack shaped silicon pillar of a vertical HVFET structure.

DESCRIPTION OF EXAMPLE EMBODIMENTS

In the following description specific details are set forth, such as material types, dimensions, structural features, processing steps, etc., in order to provide a thorough understanding of the disclosure herein. However, persons having ordinary skill in the relevant arts will appreciate that these specific details may not be needed to practice the embodiments described. It should also be understood that the elements in the figures are representational, and are not drawn to scale in the interest of clarity.

Figure 2:
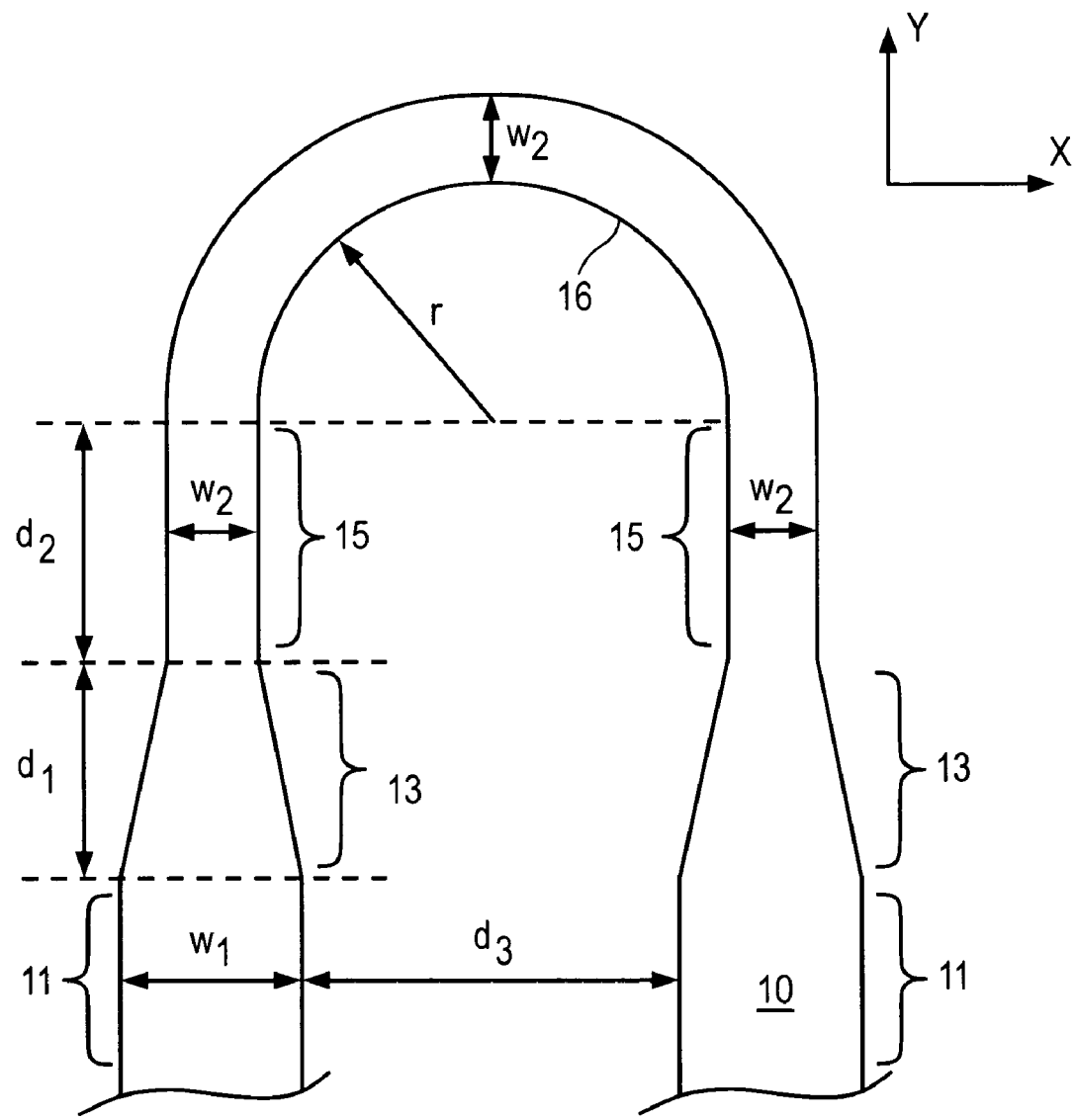
FIG. 2 illustrates an example layout of one end of a vertical HVFET structure having a narrower pillar width in the tip region relative to the fillet region.
Figure 3:
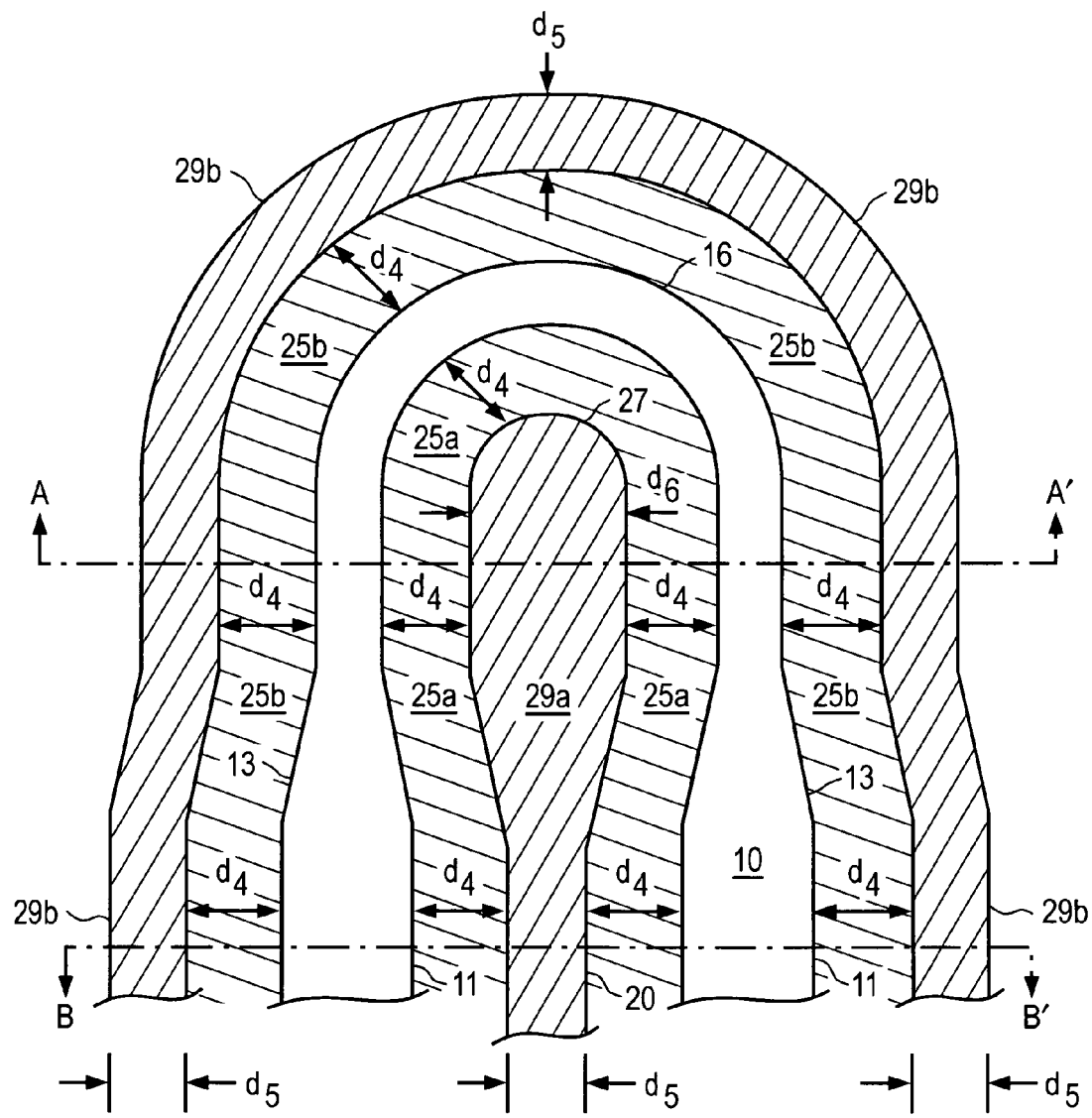
FIG. 3 illustrates the example layout of FIG. 2 with dielectric regions and field plate members added.
Figure 4:
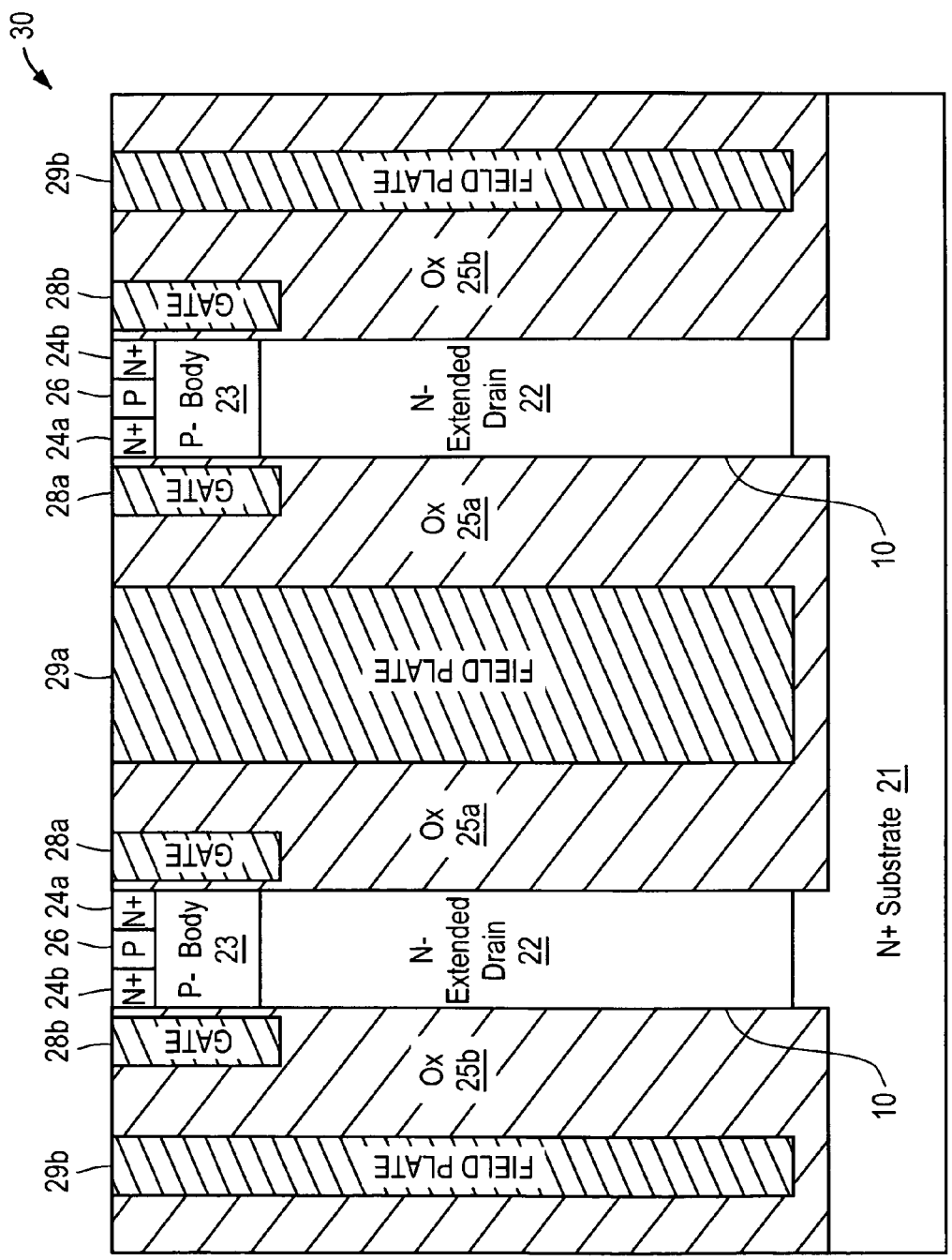
FIG. 4 illustrates an example cross-sectional side view (as taken through cut lines A-A') of the vertical HVFET structure shown in FIG. 2.
Figure 5:
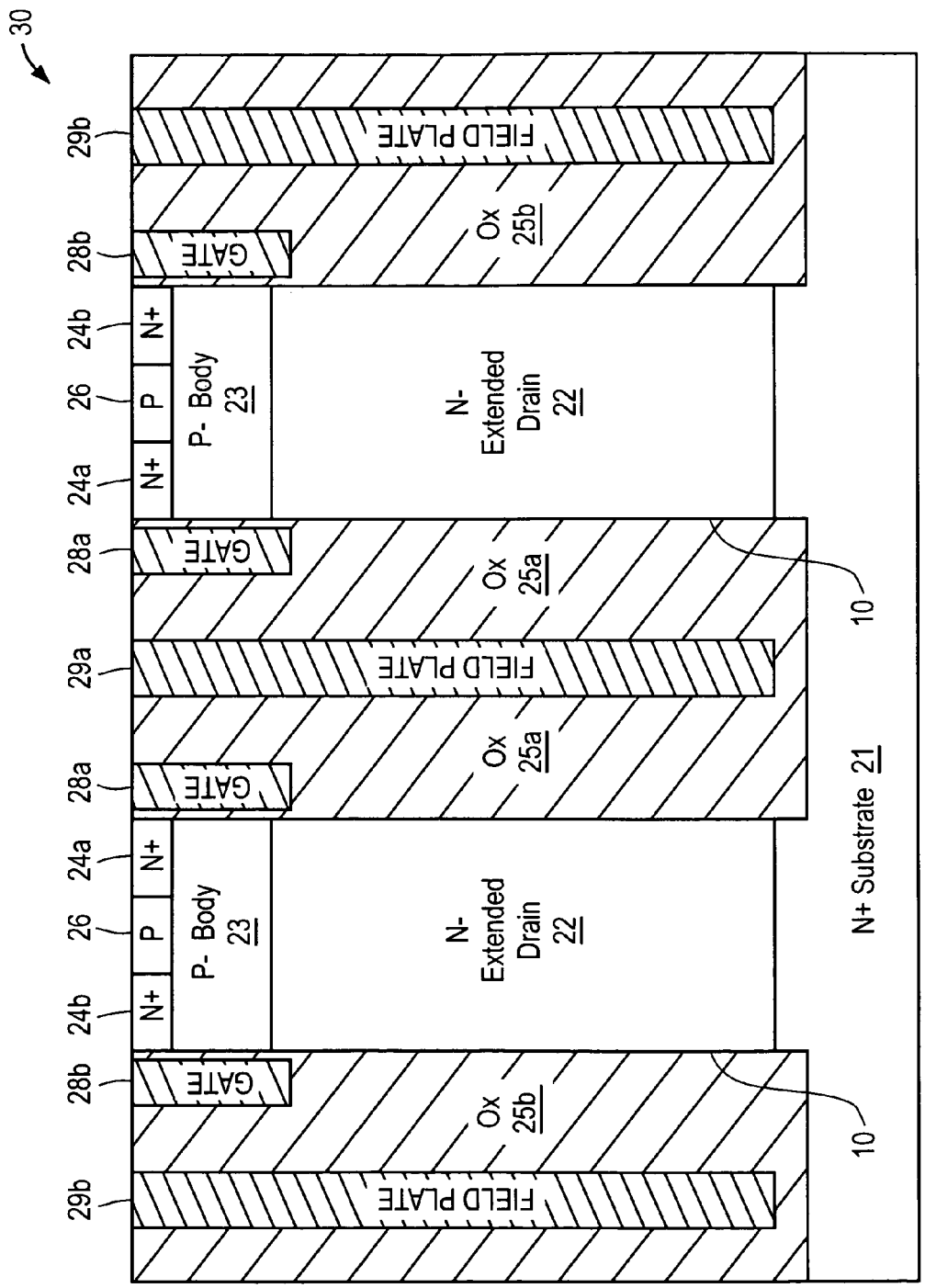
FIG. 5 illustrates an example cross-sectional side view (as taken through cut lines B-B') of the vertical HVFET structure shown in FIG. 2.

FIG. 2 illustrates an example layout of a silicon pillar 10 of a vertical HVFET. The top view of FIG. 2 shows one end of a continuous, elongated, racetrack-shaped loop (e.g., ring or oval) structure that comprises a pillar of semiconductor material surrounded on opposite sides by dielectric regions. Disposed within the dielectric regions on both sides of pillar 10 are respective gate members and conductive field plates. Although not shown in FIG. 2 for purposes of clarity, the dielectric and field plate elements are shown in FIGS. 3-5, discussed below.

In the example of FIG. 2 racetrack-shaped pillar 10 has a width (i.e., pitch) that varies from the straight fillet section to the rounded tip section. For instance, fillets 11 comprise the two substantially parallel side sections of pillar 10 that extend in the y-direction. In a typical example of a 500-700V HVFET device structure, each fillet 11 has a width, $W_1$, of approximately 2.4-2.8 µm. Fillets 11 are separated by a distance, $d_3$, of approximately 10-12 µm. Pillar 10 narrows over a transition section 13 from width $W_1$ at each end of fillet 11 to a width, $W_2$. For an example 500-700V HVFET device structure, width $W_2$ is approximately 1.8-2.2 µm. It is appreciated that in other embodiments, width $W_1$ may be wider than 2.8 µm, and width $W_2$ may be narrower than 1.8 µm, depending upon design considerations, area constraints, and photolithographic imaging limitations, etc.

In the example shown, both sides of pillar 10 are shown varying in the same linear manner (i.e., both sides tapered with the same slope) across the distance $d_1$ of transition section. In one embodiment, distance $d_1$ is approximately 3-10 µm long. Transition section 13 may be longer in other embodiments. In still other embodiments, transition section may be shorter or eliminated entirely; that is, instead of pillar 10 being tapered from the wider fillets to the narrower tip, fillets 11 may transition abruptly from width $W_1$ at each end to width $W_2$. It should also be understood that the shape of transition section 13 need not be symmetrical on each side of pillar 10. In other words, the transition from width $W_1$ to width $W_2$ may be implemented in different ways, utilizing a variety of layout shapes.

Continuing with the example of FIG. 2, extension sections 15 are shown connecting transition sections 13 with rounded tip section 16. Each extension section 15 has a width $W_2$ that is the same as that of tip section 16. Tip section 16 comprises a semi-circular shaped section of silicon having an inner radius r and a constant width $W_2$ throughout. In the embodiment shown, the length, d2, of each extension section 15 is typically from 3-10 µm long. Other embodiments may utilize longer or shorter extension sections 15. It should be further understood that certain embodiments may eliminate extension section entirely. In other words, the inclusion of extension sections 15 in the pillar layout shown FIG. 2 is optional.

Furthermore, although the example of FIG. 2 illustrates a single transition section (one on each side), it should be understood that other embodiments may include multiple transition sections, or multiple abrupt (i.e., stepped) variations in width from the wider fillet to the narrower tip section of pillar 10. In still other embodiments, the width of tip section may itself vary about radius r. For example, tip section 16 may have a width $W_2$ at the end of each transition section 15 that gradually narrows to a width $W_3$ at the center of the half-circle.

Figure 7:
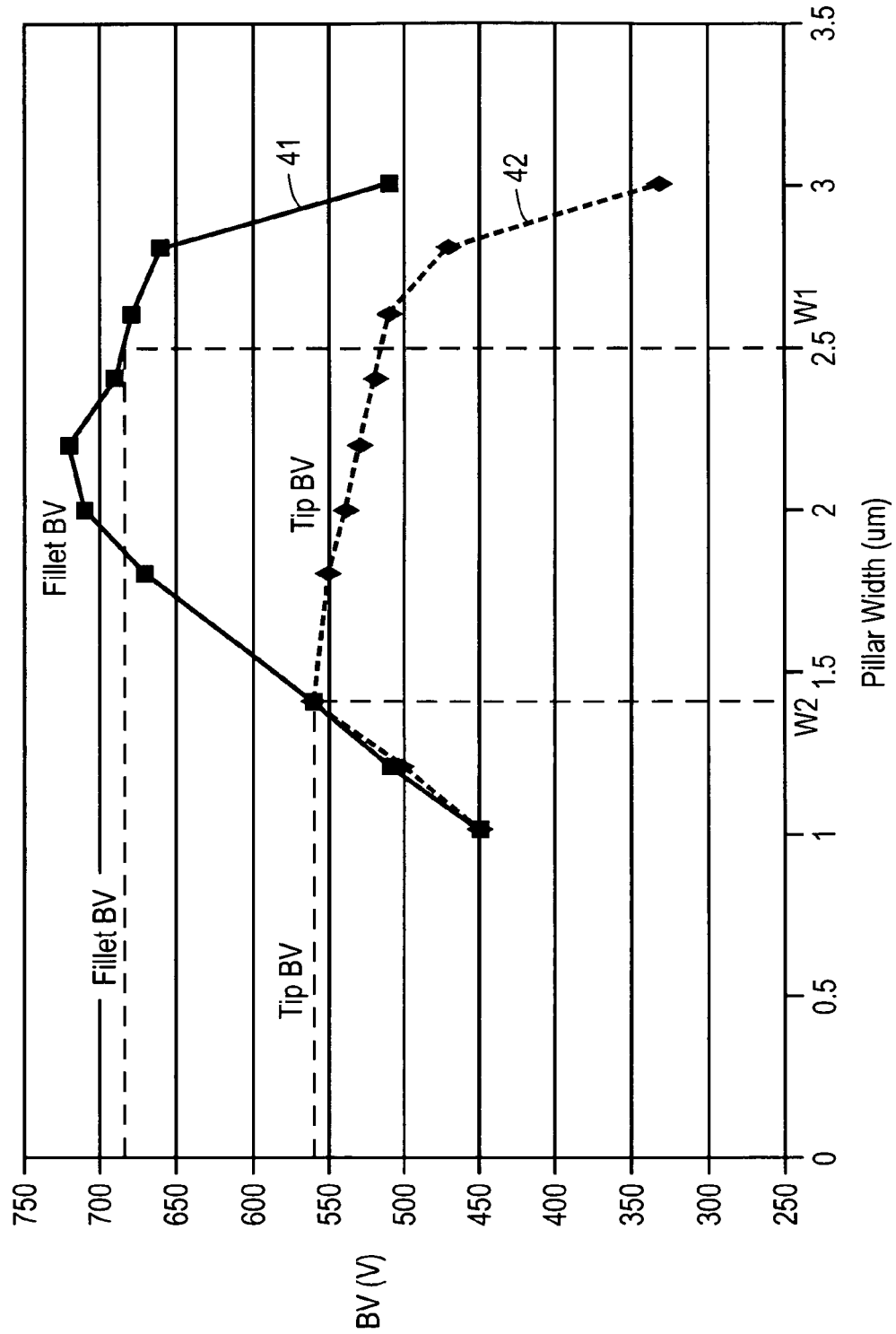
FIG. 7 is a graph showing drain breakdown voltage versus pillar width for an example vertical HVFET structure having a layout as shown in FIG. 2.

The performance advantage for a transistor device fabricated with a silicon pillar having wider fillets and a narrower tip is best understood by considering the graph shown in FIG. 7. FIG. 7 is a graph showing drain breakdown voltage (BV) versus pillar width for an example vertical HVFET structure having a layout as shown in FIG. 2. Plot 41 shows BV in the fillet sections as a function of pillar width for a given epitaxial doping level. Plot 42 shows BV in the tip section as a function of pillar width for the same epitaxial doping level. What the inventors of the subject matter disclosed herein discovered—and what was previously unknown prior to their experimentation—was the existence of a significantly higher breakdown voltage in the fillet sections as compared to the tip sections of a vertical HVFET structure having a racetrack-shaped silicon pillar—even in cases where the fillet pillar width is much larger than the tip pillar width. In other words, through experimentation it was discovered that for the optimum BV in the tip section at a width $W_2$, the fillet BV was higher than the tip BV at pillar widths greater than $W_2$ (e.g., at $W_1$) for a given epitaxial doping.

Thus, it is appreciated that by optimizing the epitaxial doping in the silicon pillar, the drain BV is maximized at a narrower pillar width in the tip section of the pillar relative to the pillar width in the fillets. This contributes to an increase in the drain BV because the peak electric field in the thin silicon pillar is increased for a narrower pillar. An increase in the peak electric allows for a correspondingly higher carrier dose in the pillar. The doping concentration in the pillar may be increased even further since dose is equal to doping multiplied by the pillar width. Stated differently, by making the pillar width in the tip section narrower (as shown in FIG. 2), the doping can be proportionally increased.

In the fillet sections of the device structure the pillar width may be increased to minimize the Rsp since the BV in the fillet sections is much higher than the BV in the tip. Persons of skill in the art will appreciate that in a practical embodiment the fillet section is much longer than the tip section, and that the fillet section dominates in determining the Rsp of the manufactured device. Also, the critical pillar width at which the BV falls off rapidly is higher for the fillet sections as compared to the tip section of the device. Practitioners in the art will appreciate that this allows for more process margin when increasing the fillet width.

FIG. 3 illustrates the example layout of FIG. 2 with dielectric regions and field plate members added. Other device structures such as gate members, contact regions, metallization layers, etc., are not shown in FIG. 3 for clarity reasons. The top view of FIG. 3 shows silicon pillar 10 separated from an inner field plate member 29a by a contiguous inner dielectric region 25a. Inner field plate member 29a terminates abruptly in a bulbous, rounded fingertip area 27. The central portion 20 of inner field plate member 29a is formed in-between fillets 11 and has a width $d_5$, whereas fingertip area 27 has a wider width $d_6$. The wider fingertip area 27 has a contour that follows that of the inside edge or surface of pillar 10 formed as contiguous regions that are arranged in a concentric manner. In this manner, the width, $d_4$, of inner dielectric region 25a remains constant at all lateral points about pillar 10. In one implementation of the structure shown in FIG. 3, width $d_4$ is in the range of 2 µm to 5 µm and width $d_5$ is in a range of 1 µm to 3 µm. In the example shown, width $d_6$ is typically wider than width $d_4$ by 0.6 µm to 1.2 µm.

The example layout of FIG. 3 also shows a contiguous outer field plate member 29b separated a distance $d_4$ from the outside edge of pillar 10 by a contiguous outer dielectric region 25b. Outer field plate member 29b and outer dielectric region 25b both laterally surround pillar 10 and follow the varying shape of the outside edge of pillar 10 such that the width, $d_4$, of outer dielectric region 25b is the same at all lateral points about pillar 10.

It is appreciated that in certain embodiments, the inner field plate member may be eliminated. In still other embodiments, a plurality of racetrack shaped silicon pillars may be formed adjacent one another with merged segments such that the outer field plate member is formed as one large ring or rectilinear structure that laterally surrounds the entire merged pillar structure. In each of these alternative embodiments narrowing occurs in rounded tip or corner section of the silicon pillar relative to the wider fillet sections.

Furthermore, in other embodiments the width, $d_4$, of the oxide dielectric need not be the same (i.e., constant) at all points around the tip section. That is, the lateral distance separating fillets 11 of pillar 10 and central portion 20 of inner field plate member 29a may be different than the distance separating rounded tip section 16 of pillar 10 and bulbous, rounded fingertip area 27 of inner field plate member 29a. Additionally, the rounded pillar tip section 16 need not have a semi-circular shape. For example, in certain embodiments the pillar tip can be a quarter-circle, leading the silicon pillar structure to have a somewhat more rectangular or even square shape.

FIG. 4 illustrates an example cross-sectional side view (as taken through cut lines A-A') of a vertical HVFET structure shown in FIG. 2. Vertical HVFET 30 is shown having a structure that includes an extended drain region 22 of N-type silicon formed on an N+ doped silicon substrate 21. Substrate 11 is heavily doped to minimize its resistance to current flowing through to the drain electrode, which is located on the bottom of the substrate in the completed device. In one embodiment, extended drain region 22 is part of an epitaxial layer which comprises pillar 10, and which extends from substrate 11 to a top surface of the silicon wafer. A P-type body region 23 and N+ doped source regions 24a & 24b laterally separated by a P-type region 26, are formed near a top surface of the epitaxial layer. As can be seen, P-type body region 23 is disposed above and vertically separates extended drain region 22 from N+ source regions 24a & 24b and P-type region 26.

In one embodiment, the doping concentration of the portion of epitaxial layer which comprises extended drain region 22 is linearly graded to produce an extended drain region that exhibits a substantially uniform electric-field distribution. Linear grading may stop at some point below the top surface of the epitaxial layer.

Extended drain region 22, body region 23, source regions 24a & 24b and P-type region 26 collectively comprise a mesa or pillar 10 (both terms are used synonymously in the present application) of silicon material in the example vertical transistor structure shown in FIG. 4. Vertical trenches formed on opposite sides of pillar 10 are filled with a layer of dielectric material (e.g., oxide) that makes up dielectric regions 25a & 25b. Note that the depth of the vertical trenches is deeper than the thickness of the epitaxial layer by about 5 µm in this example.

The height and width of pillar 10, as well as the spacing between adjacent vertical trenches may be determined by the breakdown voltage requirements of the device. For example, in a typical 500-700V HVFET, pillar 10 has a vertical height (thickness) in a range of about 40 µm to 60 µm thick. The lateral oxide thickness (width $d_4$) is about 3-5 µm, and the epitaxial layer doping varies linearly from approximately 1-2 E15/cm3 at the top of extended drain region 22 to around 2-3 E16/cm3 at the bottom.

Figure 1:
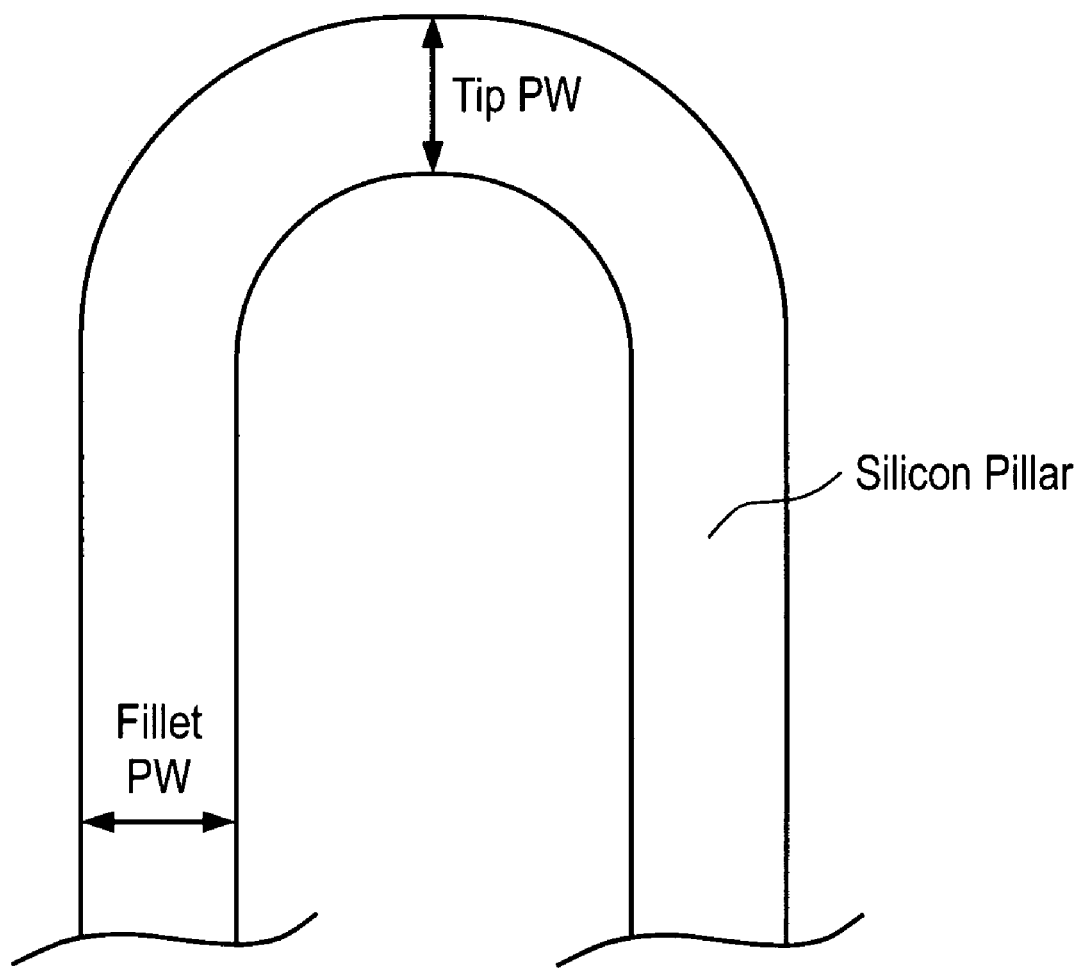
FIG. 1 is a top view of a layout of a portion of a prior art vertical high-voltage vertical field-effect transistor (HVFET).

In another embodiment, instead of arranging P-type region 26 between N+ source regions 24a & 24b across the lateral width of pillar 10 (as shown in FIG. 4), N+ source regions and P-type regions may be alternately formed at the top of pillar 10 across the lateral length of pillar 10. In other words, a given cross-sectional view such as that shown in FIG. 1 would have either an N+ source region 24, or a P-type region 26, that extends across the full lateral width of pillar 10, depending upon where the cross-section is taken. In such an embodiment, each N+ source region 24 is adjoined on both sides (along the lateral length of the pillar) by P-type regions 26. Similarly, each P-type region 26 is adjoined on both sides (along the lateral length of the pillar) by N+ source regions 24.

Dielectric regions 25a & 25b may comprise silicon dioxide, silicon nitride, or other suitable dielectric materials. Dielectric regions 25 may be formed using a variety of well-known methods, including thermal growth and chemical vapor deposition. Disposed within inner dielectric layer 25a, and fully insulated from substrate 21 and pillar 10, is inner field plate member 29a. Outer field plate member 29b is shown disposed in outer dielectric layer 25b, similarly insulated from substrate 21 and pillar 10. The conductive material used to from field plates 29 may comprise a heavily doped polysilicon, a metal (or metal alloys), a silicide, or other suitable materials. In the completed device structure, field plates 29a & 29b normally function as capacitive plates that may be used to deplete the extended drain region of charge when the HVFET is in the off state (i.e., when the drain is raised to a high voltage potential).

The trench gate structure of vertical HVFET transistor 30 comprises gate members 28a & 28b, each respectively disposed in oxide regions 25a & 25b on opposite sides of pillar 10 between field plates 29a & 29b and body region 23. A high-quality, thin (e.g., ~500 Å) gate oxide layer separates gate members 28 from the sidewalls of pillar 10 adjacent body region 23. Gate members 28 may comprise polysilicon, or some other suitable material. In one embodiment, each gate member 28 has a lateral width of approximately 1.5 µm and a depth of about 3.5 µm.

Practitioners in the art will appreciate that N+ source regions 24 and P-type body region 23 near the top of pillar 10 may each be formed using ordinary deposition, diffusion, and/or implantation processing techniques. After formation of the N+ source region 24, HVFET 30 may be completed by forming source, drain, gate, and field plate electrodes that electrically connect to the respective regions/materials of the device using conventional fabrication methods (not shown in the figures for clarity reasons).

FIG. 5 illustrates an example cross-sectional side view (as taken through cut lines B-B') of the vertical HVFET structure shown in FIG. 2. The constituent elements shown in FIG. 5 are the same as those in FIG. 4 (discussed above) except for the lateral width of the inner field plate 29a and the lateral width of pillar 10. In FIG. 4, the cross-sectional side view is taken through the narrower extension section of the pillar where the inner field plate is relatively wide as compared to the central fillet section of field plate 29a shown in FIG. 5. Because the cross-sectional side view of FIG. 5 is taken to the fillet section, field plate 29a is relatively narrow, and pillar 10 is relatively wide as compared to the extension or tip section of the device structure.

FIGS. 6A-6E illustrates various example layouts of one end of a racetrack shaped silicon pillar of a vertical HVFET structure. For instance, FIG. 6A shows an embodiment with a transition section 13 that tapers or narrows the pillar from fillet 11 to extension section 15 on the outside edge only. The inside edge of the silicon pillar remains straight from fillet 11 to tip section 16. Similarly, the top view of FIG. 6B shows an alternate embodiment with a transition section 13 that tapers on the inside edge only—the outside edge being unchanged (i.e., straight or linear) from fillet 11, through sections 13 & 15, to tip section 16.

FIG. 6C shows yet another variation in which fillet 11 extends all the way to tip section 16, essentially eliminating transition section 13 and extension section 15. Instead of a tapered narrowing, the transition from the wider fillet section 11 to the narrower tip section 16 occurs abruptly at notch or step 17a, located on the outside edge of the pillar. FIG. 6D shows the same approach as in FIG. 6C, but with a step 17b abrupt transition in pillar width occurring on the inside edge of the silicon pillar.

FIG. 6E illustrates still another variation which is similar to the example embodiment of FIG. 2, but with extension section 15 eliminated. In other words, transition section 13 tapers or narrows the width of the pillar directly between fillet 11 and tip section 16. Practitioners in the art will appreciate that any of the embodiments shown in FIGS. 6A-6D may be likewise implemented without extension section 15, i.e., with a tip section that begins at the end of transition section 13. Still other embodiments may be fabricated with multiple steps or a combination of the various parameters shown by way of example.

In one embodiment, each of the racetrack transistor segments of the vertical transistor device structure has a width (i.e., pitch) in the x-direction of approximately 13 µm and a length in the y-direction in a range of about 400 µm to 1000 µm, with a pillar height of about 60 µm. In other words, the length to width ratio of the individual racetrack transistor segments comprising a vertical HVFET is in a range of about 30 to 80. In a specific embodiment, the length of each racetrack shaped segment is at least 20 times greater than its pitch or width.

Practitioners in the art will appreciate that in the completed device structure, patterned metal layers are used to interconnect each of the silicon pillars 10 of the individual transistor segments. That is, in a practical embodiment, all of the source regions, gate members, and field plates are respectively wired together to corresponding electrodes on the semiconductor die. In the example layouts shown, the width of dielectric regions separating the silicon pillars, as well as the width of the field plates, is substantially uniform across the semiconductor die. Laying out the transistor segments with uniform widths and separation distances prevents the formation of voids or holes following the processing steps used to conformably deposit the layers that comprise dielectric regions 25 and field plates 29.

Although the above embodiments have been described in conjunction with a specific device types, those of ordinary skill in the arts will appreciate that numerous modifications and alterations are well within the scope of the present invention. For instance, although HVFETs have been described, the methods, layouts and structures shown are equally applicable to other structures and device types, including Schottky, diode, IGBT and bipolar structures. Accordingly, the specification and drawings are to be regarded in an illustrative rather than a restrictive sense.

We claim:

1. A vertical high-voltage field-effect transistor (HVFET) comprising:
   a pillar of semiconductor material arranged in a closed loop layout having at least two substantially parallel and substantially linear fillet sections each having a first width, and at least two rounded sections, the rounded sections having a second width narrower than the first width, a source region of a first conductivity type being disposed at or near a top surface of the pillar;
   first and second dielectric regions disposed on opposite sides of the pillar, respectively, the first dielectric region being laterally surrounded by the pillar, and the second dielectric region laterally surrounding the pillar;
   first and second field plates respectively disposed in the first and second dielectric regions.

2. The vertical HVFET of claim 1 further comprising a body region of a second conductivity type disposed in the pillar beneath the source region.

3. The vertical HVFET of claim 2 further comprising a substrate, an extended drain region of the first conductivity type being disposed in the pillar above the substrate, the body region separating the source region from the extended drain region in the vertical direction.

4. The vertical HVFET of claim 2 further comprising first and second gate members respectively disposed in the first and second dielectric regions at or near the top surface of the pillar adjacent the body region, the first and second gate members being separated from the body region by a gate oxide.

5. The vertical HVFET of claim 1 wherein the loop layout is formed in a racetrack shape.

6. The vertical HVFET of claim 1 wherein the pillar is separated from each of the first and second field plates by a first lateral distance that is substantially constant at all points along the pillar.

7. The vertical HVFET of claim 6 wherein the first lateral distance is substantially equal to a lateral thickness of the first and second dielectric regions respectively separating the field plates from the pillar.

8. A power field-effect transistor (FET) comprising:
   a pillar of semiconductor material having a vertical thickness, the pillar being formed in a loop layout that includes:
      a pair of substantially parallel and substantially linear fillet sections, each fillet section having a first width, the fillet sections extending in a first lateral direction; and
      a pair of rounded tip sections, the rounded tip sections having a second width narrower than the first width;
   wherein the pillar further includes a transition section at each end of each fillet section, the transition section narrowing the pillar from the first width to the second width over a first lateral distance; and
   a source region of a first conductivity type being disposed at or near a top surface of the pillar.

9. The power FET of claim 8 wherein the source region comprises first and second regions of the first conductivity type laterally separated by a third region of a second conductivity type.

10. The power FET of claim 8 wherein the transition section has at least one tapered edge.

11. The power FET of claim 8 wherein the transition section includes a pair of tapered edges located on opposite sides of the pillar.

12. The power FET of claim 8 wherein each transition section includes a pair of tapered edges disposed symmetrically on opposite lateral sides.

13. A power field-effect transistor (FET) comprising:
   a pillar of semiconductor material formed over a substrate of a first conductivity type, the pillar having a vertical thickness and being formed in a loop layout that includes:
      a pair of substantially parallel and substantially linear fillet sections, each fillet section having a first width, the fillet sections extending in a first lateral direction; and
      a pair of rounded tip sections, the tip sections having a second width narrower than the first width;
   a source region of the first conductivity type disposed at or near a top surface of the pillar;
   a body region of a second conductivity type disposed in the pillar beneath the source region; and
   an extended drain region of the first conductivity type that extends vertically from the body region to the substrate.

14. The power FET of claim 13 further comprising first and second dielectric regions disposed on opposite sides of the pillar, respectively, the first dielectric region being laterally surrounded by the pillar, and the second dielectric region laterally surrounding the pillar.

15. The power FET of claim 14 further comprising first and second field plates respectively disposed in the first and second dielectric regions, the pillar being separated from each of the first and second field plates by a distance that is substantially constant at all points along the pillar.

16. The power FET of claim 13 wherein the pillar further includes transition sections, each transition section having at least one tapered edge that narrows, over a first lateral distance, the first width of the fillet sections to the second width.

17. The power FET of claim 16 wherein the pillar further includes extension sections, each extension section having the second width and joining a corresponding one of the transition section to one end of the rounded tip sections.

18. The power FET of claim 13 wherein the loop layout is formed in the shape of a racetrack.

* * * * *